(12) United States Patent
Obata

(10) Patent No.: US 8,995,510 B2
(45) Date of Patent: Mar. 31, 2015

(54) APPARATUS AND METHOD FOR ANALYZING A SIGNAL UNDER TEST

(75) Inventor: Toshiaki Obata, Yokohama (JP)

(73) Assignee: Tektronix, Inc., Beaverton, OR (US)

( * ) Notice: Subject to any disclaimer, the term of this patent is extended or adjusted under 35 U.S.C. 154(b) by 1089 days.

(21) Appl. No.: 12/055,210

(22) Filed: Mar. 25, 2008

(65) Prior Publication Data

US 2009/0245339 A1 Oct. 1, 2009

(51) Int. Cl.
*H04B 3/46* (2006.01)
*H04B 17/00* (2006.01)
*H04Q 1/20* (2006.01)
*G06T 11/20* (2006.01)
*G01R 31/317* (2006.01)
*H04L 1/20* (2006.01)

(52) U.S. Cl.
CPC ........ *G06T 11/206* (2013.01); *G01R 31/31711* (2013.01); *H04L 1/205* (2013.01)
USPC ............................. 375/224; 375/231; 370/341

(58) Field of Classification Search
None
See application file for complete search history.

(56) References Cited

U.S. PATENT DOCUMENTS

| | | | |
|---|---|---|---|
| 3,909,671 A * | 9/1975 | Nakaya .......................... | 315/395 |
| 5,373,327 A * | 12/1994 | McGee et al. ................. | 348/645 |
| 6,760,676 B2 * | 7/2004 | Nygaard, Jr. .................... | 702/79 |
| 6,806,877 B2 | 10/2004 | Fernando | |
| 7,478,011 B2 * | 1/2009 | Gebara et al. ................. | 702/176 |
| 2003/0187620 A1 * | 10/2003 | Nygaard et al. .............. | 702/189 |
| 2004/0017366 A1 * | 1/2004 | Narita ........................... | 345/208 |
| 2004/0102910 A1 * | 5/2004 | Letts ............................... | 702/67 |
| 2004/0200969 A1 * | 10/2004 | Odogba et al. ........... | 250/370.09 |
| 2005/0222821 A1 * | 10/2005 | Conner ......................... | 702/189 |
| 2006/0047449 A1 * | 3/2006 | Petersen et al. ................ | 702/68 |
| 2006/0279581 A1 * | 12/2006 | Ericson ......................... | 345/603 |
| 2007/0223569 A1 * | 9/2007 | Obata ........................... | 375/228 |
| 2008/0181123 A1 * | 7/2008 | Huang et al. .................. | 370/252 |
| 2013/0156082 A1 * | 6/2013 | Engholm et al. .............. | 375/224 |

* cited by examiner

*Primary Examiner* — Shuwang Liu
*Assistant Examiner* — Gina McKie
(74) *Attorney, Agent, or Firm* — Thomas F. Lenihan; Marger Johnson & McCollom PC

(57) ABSTRACT

A portion of a signal under test corresponding to a portion of interest in an eye pattern is easily identified. An eye pattern display area displays an eye pattern that is derived from sample data of a signal under test in a bitmap form and shows frequency information with colors or brightness. A user selects an arbitrary point on the eye pattern display area with a cross-hair shaped mouse cursor, by manipulating a mouse. Thereafter, a waveform passing through the selected point is discriminably displayed, for example, with highlighted display on the eye pattern. Further, the corresponding portion of a waveform in the waveform display area is distinguishably displayed, such as with a highlighted display.

7 Claims, 6 Drawing Sheets

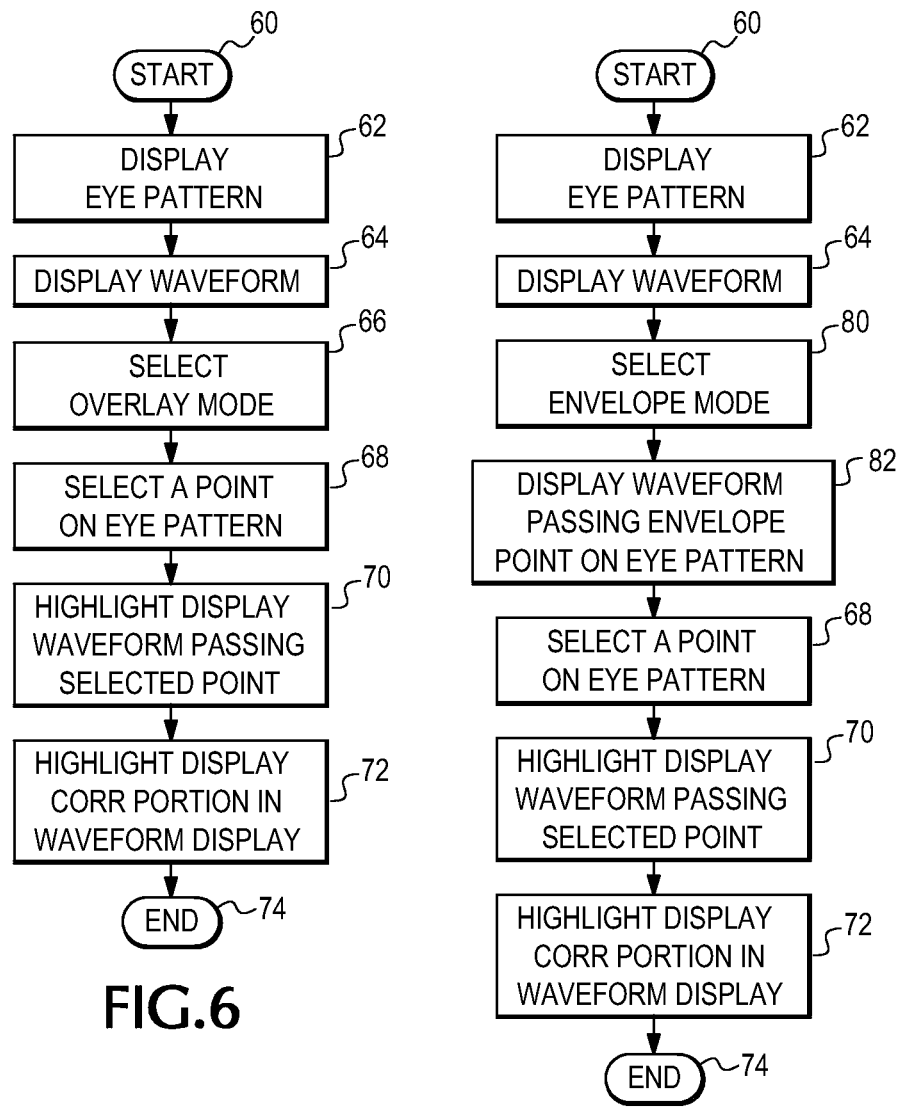

APPARATUS AND METHOD FOR ANALYZING A SIGNAL UNDER TEST

FIELD OF THE INVENTION

The present invention relates to technologies to analyze quality of a signal under test by displaying an eye pattern and especially to an apparatus, method and program for analyzing the signal.

BACKGROUND OF THE INVENTION

A digital signal is a modulated signal according to a coding of one and zero, and may be a rectangle pulse signal, for example. If the coding is NRZ (Non Return to Zero), the digital signal is generated as a pulse signal that "0" is assigned to L (Low) level and "1" to H (High) level every UI (unite interval). FIG. 1 shows an example. If a propagation path between transmitter and receiver is ideal, the waveform of the rectangle pulse signal would not change after the propagation and then would be an ideal waveform shown with a dotted line. The receiver detects values of the rectangle pulse signal every UI to demodulate the 1 and 0 data.

An actual transmitted signal usually has distortions relative to the waveform of an ideal signal depending on characteristics of the propagation path and signal speed, as shown as solid lines in FIG. 1. That is, the information the digital signal transfers is digital data comprising 1s and 0s but the signal itself is an analog signal. The waveform of the digital signal is displayed as an eye pattern with a waveform display apparatus, such as a digital oscilloscope, that samples and stores an input signal as sample data to measure quality of the signal.

FIG. 2 is a functional block diagram of a waveform display apparatus, such as an oscilloscope. A CPU 10 controls operations of the apparatus according to programs stored in a hard disk drive (HDD) 14. The CPU 10 makes a memory 12 read data as necessary to conduct processes. The HDD 14 stores programs realizing functions necessary for analyzing a signal under test such as an eye pattern display in addition to operating software (OS) that controls basic operations of the apparatus. They are coupled via a bus 16. They may be the same devices as used in a personal computer (PC).

Operation panel 18 and mouse 20 are coupled to the bus 16 via an I/O port 22. A user can set up the waveform display apparatus via them. An external storage device 24 can be coupled via an I/O port 22 and the sample data of the signal under test, generated by the waveform display apparatus, may be copied to the external storage device 24. If the external storage device 24 is decoupled and coupled to a PC (not shown), then the stored sample data can be copied to a HDD of a PC.

A preamplifier 26 properly adjusts the signal under test and provides it to analog to digital converter (ADC) 28 and trigger detector 30. The ADC 28 samples the signal under test at a frequency that is well higher than the frequency of the signal under test to generate the sample data. A fast acquisition memory 32 stores the sample data sequentially. When fast acquisition memory 32 is full, the older data is deleted sequentially. When the trigger detector 30 finds a portion matching its trigger criteria (i.e., a trigger condition in the sample data), it controls acquisition memory 32 to store data surrounding the trigger event (i.e., pre-trigger and post-trigger sample data) until acquisition memory 32 is full and thereafter, stops the acquisition. The acquired sample data may be transferred to the HDD, if necessary. CPU 10 processes the sample data in a bitmap form to generate an eye pattern as shown in FIG. 3. A display apparatus 34 displays the sample data as a waveform along a time axis or as an eye pattern according to user settings.

Recent waveform display instruments often adopt the same OS as a personal computer (PC); such an instrument are the DPO-series of oscilloscopes manufactured by Tektronix, Inc., Beaverton, Oreg., U.S.A. Therefore, an optional program for the waveform display apparatus may be developed with a PC and installed on the waveform display apparatus to provide an additional feature of the waveform display apparatus. Conversely, if the same program for processing the sample data as the waveform display apparatus is installed on a PC, a user can conduct the same processes with the PC by copying the sample data, generated in the waveform display apparatus, to the PC. In this way, a waveform display apparatus and a PC resemble each other in that they each have a processing unit such as a CPU.

FIG. 3 is an eye pattern display example derived from sample data of 8 bit patterns from 000 through 111. In the example, timing of bit patterns are aligned, frequency information derived by counting the number of the sample data of each pixel is converted to a color or brightness. The frequency information is indicated with a histogram using a rainbow of seven colors wherein the frequency is higher as the color is closer to red and lower as it approaches violet. An eye pattern may also be referred to as an eye diagram.

In the eye pattern display, large distortions of waveforms lead to a decrease in the area of the formed eye, a large difference from the ideal form. For example, U.S. Pat. No. 6,806,877 discloses a technology that a mask having a shape according to user settings is provided on an eye pattern to evaluate whether the mask touches the eye pattern or not to measure quality of the digital signal.

An eye pattern image is derived by collecting many bit patterns and is very useful for measuring whether the overall quality of a signal under test is good or bad. However, even if a portion of the eye pattern indicates that the signal under test has a problem, it concurrently makes it difficult to identify which portion of the signal under test is specifically that portion. Therefore, it would be preferable to easily determine which portion of a signal under test is a problem portion, found within the eye pattern, while measuring overall quality of a signal under test with the eye pattern display.

SUMMARY OF THE INVENTION

The present invention relates to a signal analyzer using an eye pattern display. Eye pattern display means displays an eye pattern that is made from sample data of a signal under test in a bitmap form and indicates frequency information with colors or brightness. A user selects an arbitrary point on the displayed eye pattern with selecting means that is typically realized with a mouse. Then, the eye pattern display means distinguishably displays a waveform that passes through the selected point with, for example, a highlighted display.

In another embodiment, a signal analyzer identifies envelope points of an eye pattern and determines a waveform passing through the envelope points to display the waveform passing through the envelope points with the eye pattern display means. If these processes are done with respect to each bit pattern it would make it easier to find a problem portion though it increases the calculation processes.

In addition, means for setting a mask condition on the eye pattern may be provided and a mode of displaying a waveform that passes through points satisfying the mask condition with the eye pattern display means may be provided. The present invention can easily be used to detect a portion of interest in a signal under test.

The present invention may further have means for selecting a bit pattern to display the eye pattern and the waveform of the selected bit pattern with the eye pattern display means. This shows which bit pattern forms a portion having a problem.

The present invention may further have a waveform displaying means for displaying the sample date of the signal under test as a waveform to distinguishably display a portion of the waveform displayed with the waveform displaying means corresponding to the waveform distinguishably displayed with the eye pattern display means. When a problem is found with the eye pattern it allows easily determining where it is in the waveform and makes it easier to investigate the detail.

Another viewpoint of the present invention is a method for analyzing a signal. It has a step of displaying an eye pattern that is made from sample data of a signal under test in a bitmap form and shows frequency information with colors or brightness, a step of selecting an arbitrary point on the eye pattern and a step of distinguishably displaying a waveform passing through the selected point in the eye pattern. It may further have a waveform display step of displaying the sample data as a waveform wherein a portion of the waveform displayed in the waveform displaying step corresponding to the waveform distinguishably displayed in the eye pattern is distinguishably displayed.

A further different viewpoint of the present invention is a signal analysis apparatus having means for computing and displaying, as well as executing some functions. It may execute a function of displaying an eye pattern that is derived from sample data of a signal under test in a bitmap form and indicates frequency information with colors or brightness, a function of selecting an arbitrary point on the eye pattern, and a function of distinguishably displaying a waveform that passes through the selected point in the eye pattern. The means for computing and displaying may be a PC or a waveform apparatus such as oscilloscope that features a general-purpose CPU and OS, for example. A control program may cause the apparatus having means for computing and displaying, to further execute functions of displaying the sample data as a waveform, and distinguishably displaying a portion of the waveform displayed in the waveform displaying function corresponding to the waveform distinguishably displayed in the eye pattern.

BRIEF DESCRIPTION OF THE DRAWINGS

FIG. 6 is a flowchart of an process embodiment of a signal analysis method according to the present invention FIG. 7 is a flowchart of another process embodiment of a signal analysis method according to the present invention

DETAILED DESCRIPTION OF THE DRAWING

Figure 1:
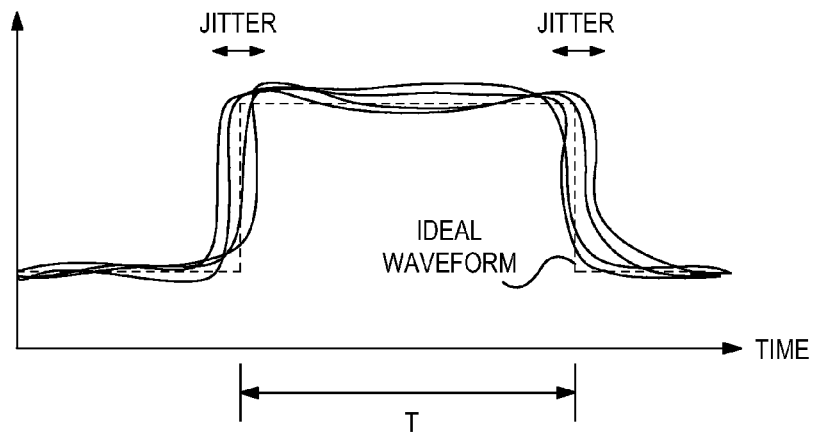
FIG. 1 is a graph for a digital signal using rectangular pulse (i.e., square wave) signal
Figure 2:
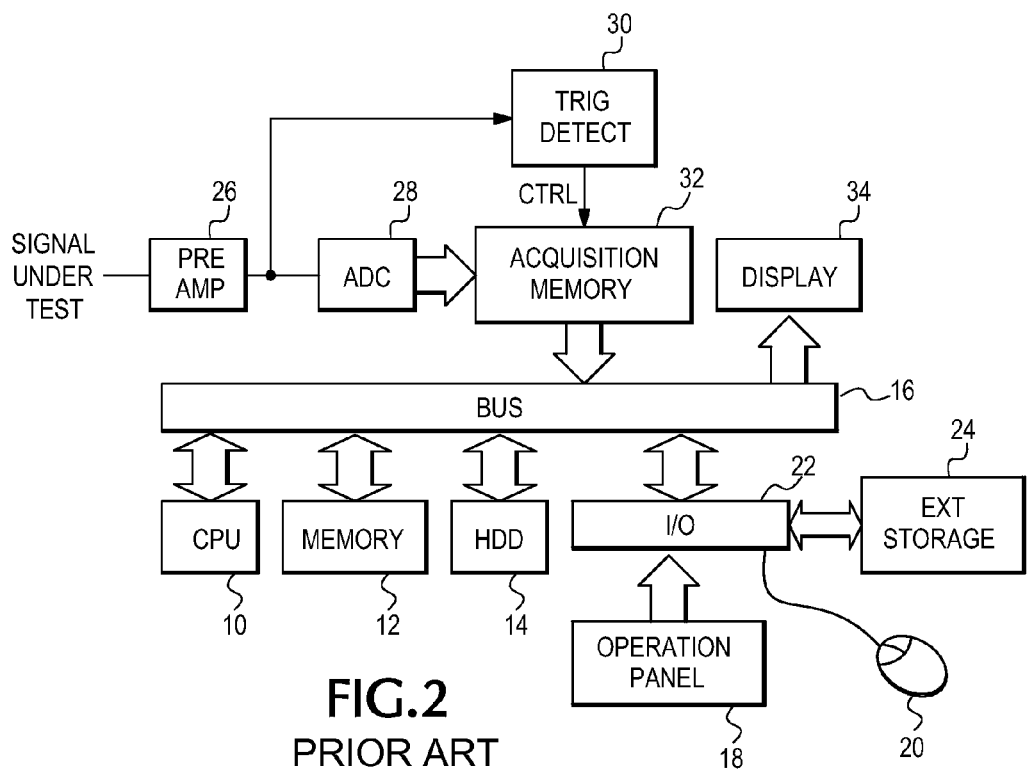
FIG. 2 is a functional block diagram of an embodiment of a waveform display apparatus
Figure 3:
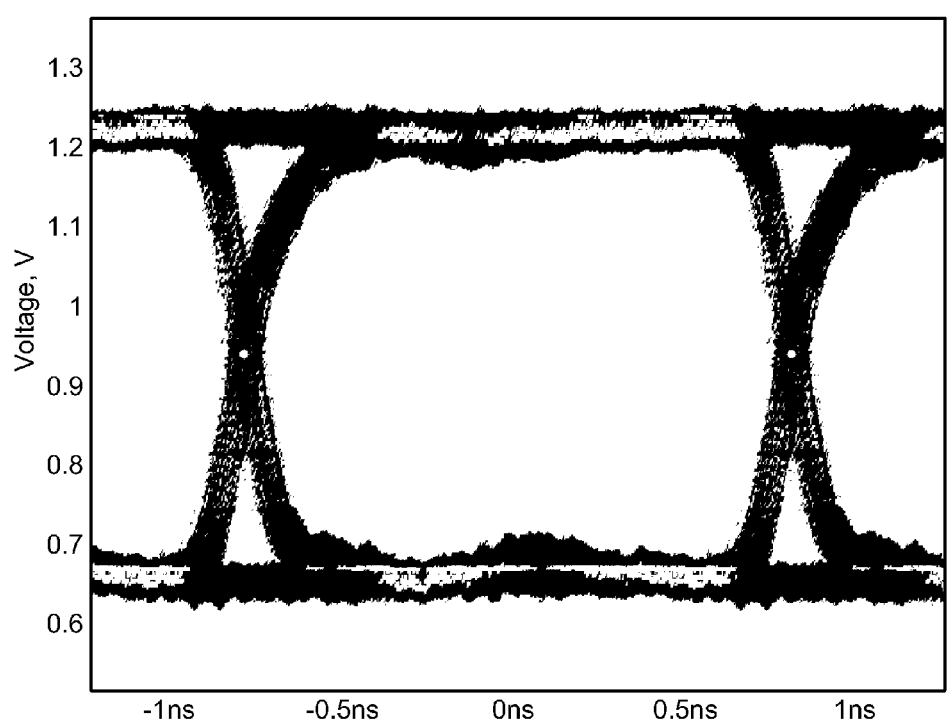
FIG. 3 is an embodiment of a eye pattern display of a digital signal using a waveform display apparatus

A signal analyzer according to the present invention can be realized by installing a function addition program on a conventional waveform display apparatus that is described above with FIG. 2. The waveform display apparatus may be a digital oscilloscope as described above, for example. OS that is also used in a PC, etc. is installed on it so that operation of GUI (Graphical User Interface) with mouse, etc. and multitask operation with multi-windows are available. Conversely, the present invention may be realized by installing a program including the present invention on a PC and copying sample data derived from a signal under test with the waveform display apparatus to the PC. That is, the present invention can be realized by installing a program including the present invention on an apparatus that has computing means such as a CPU and a display apparatus. The present invention is explained below based on embodiments using a waveform display apparatus but it can be similarly realized with a PC.

Figure 4:
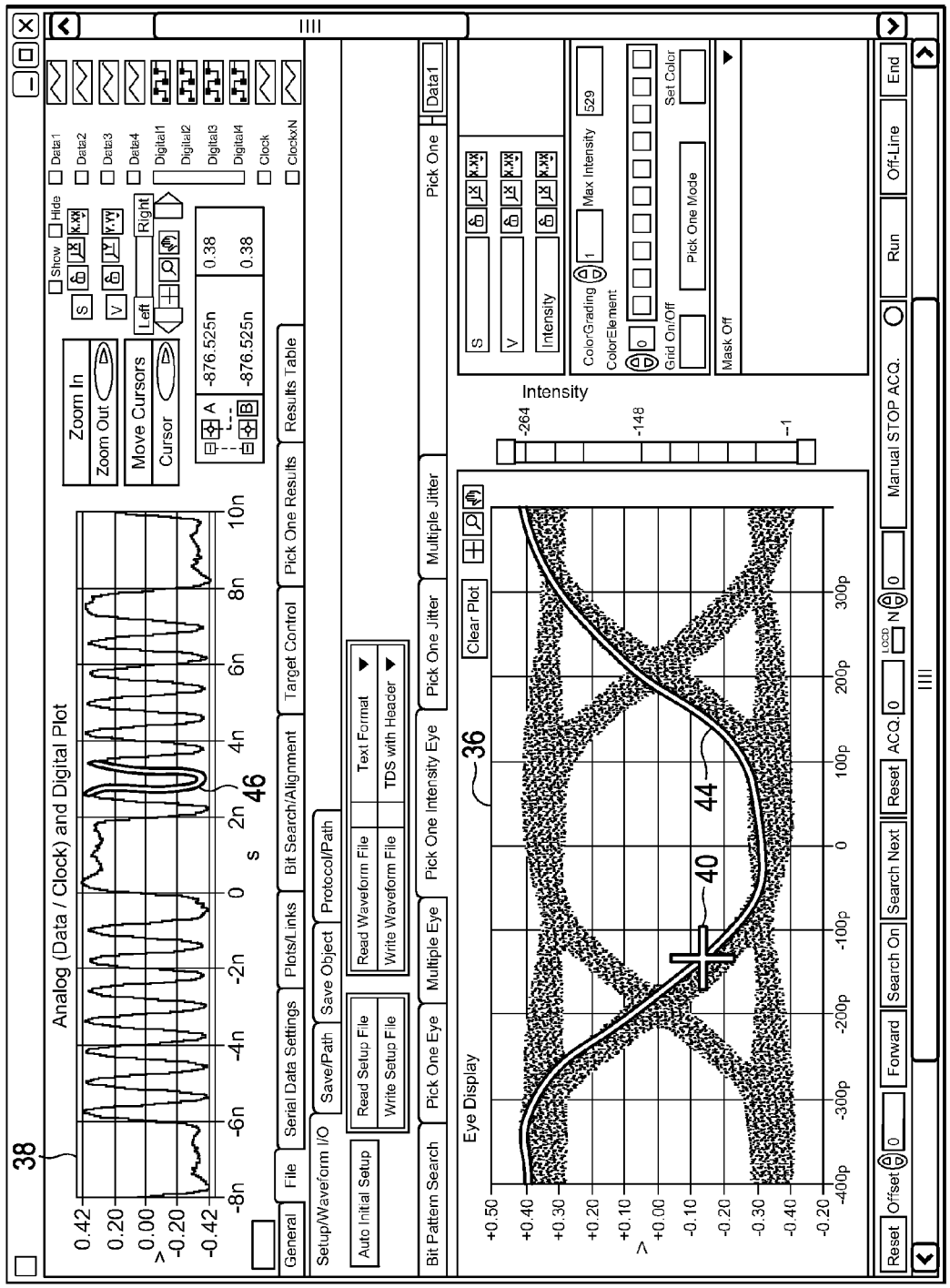
FIG. 4 is an embodiment of eye pattern and waveform display according to the present invention

FIG. 4 is an embodiment of a display according to the present invention and it is realized as a window within the display screen of the display 34. The window has an eye pattern display area 36 displaying an eye pattern derived from sample data of a signal under test, and a waveform display area 38 displaying a waveform as a continuous line by plotting the sample data with interpolation. Besides, it displays various objects for necessary settings.

When a user brings a mouse cursor to the eye pattern display area 36 by manipulating the mouse (pointing device) 20 the mouse cursor changes the shape to a cross-hair shape, or to a cross-shaped mouse cursor 40. As the user puts the cross-hair shaped mouse cursor 40 onto a point (pixel) of interest in the eye pattern, a waveform 44 passing through the point is displayed with a highlight (i.e., brightened) to make the waveform display easily distinguished from its surroundings.

A portion 46 corresponding to the highlight-displayed waveform in the eye pattern is highlight-displayed in the waveform displayed in the waveform display area 38 so that it is easily identified. When the user located the cross-shaped mouse 40 and if the portion corresponding to the high-lightened waveform in the eye pattern is not displayed in the waveform display area 38 the display area of the waveform display area 38 may be automatically scrolled to display the corresponding portion 46.

When there is a plurality of waveforms passing through the point, they are displayed with highlighted continuous lines. In this case, the corresponding portions of the waveform in the waveform display area 38 would also be highlight-displayed but the display range is limited and they could not all be displayed at once. In this case, the display range may be scrolled to the next one by pressing a predetermined key of operation panel 18. In this way, the high-lightened waveform portions are displayed by turns. Further, the waveforms that are highlight-displayed in the eye pattern may have different colors respectively and the corresponding portions of the waveform in the waveform display area 38 may be highlight-displayed with the same colors respectively to easily recognize the corresponding relationship.

Figure 5:
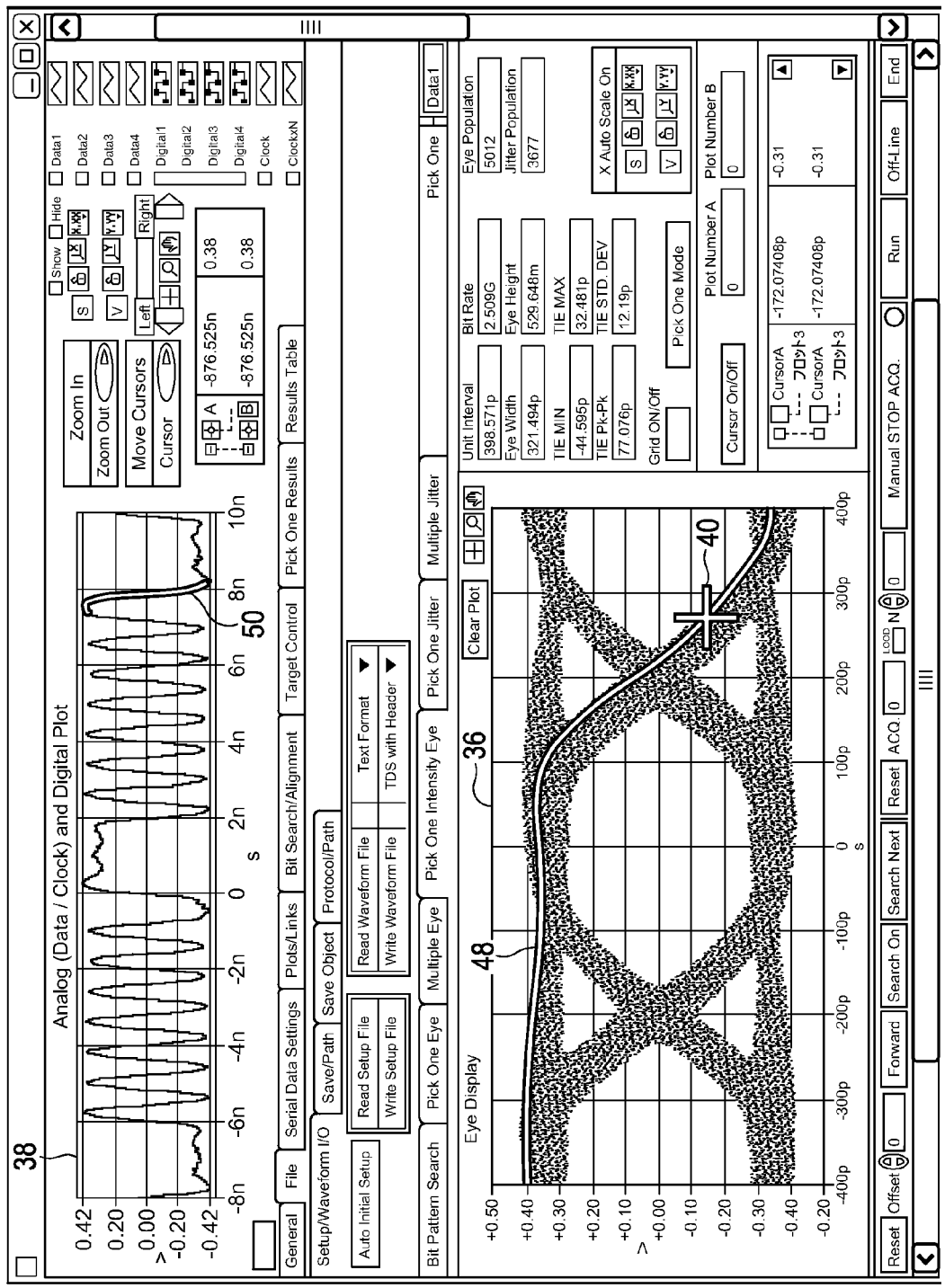
FIG. 5 is another embodiment of eye pattern and waveform display according to the present invention

FIG. 5 is another display embodiment according to the present invention. A problem portion (i.e., a portion of interest) of a signal under test found in the eye pattern display would be an outside portion of the normal range and would often exist on the envelope of the eye pattern. In the embodiment shown in FIG. 5, the waveform display apparatus identifies points of upper and lower envelopes with respect to each of eight bit patterns from 000 to 111 and displays a waveform passing through the envelope points as continuous lines in the eye pattern display. If there is a waveform that passes through a problem portion, the waveform shape would suggest which bit pattern of the eight types has the problem. As described, when a point on the waveform passing through the problem portion is selected with the cross-hair shaped mouse cursor 40, a waveform 48 passing through the point is highlight-displayed and the corresponding portion 50 displayed in the waveform display area 38 is also highlight-displayed, which allows identifying which portion of the waveform has the problem and provides more detailed investigation. To display the waveform passing through the envelope as a waveform with a line, the display setting may be changed via the user interface of the screen or operation panel 18. For this embodiment, it would be preferable to identify the envelope points of the respective bit patterns to display the waveform but, for simplicity, envelope points of the eye pattern may be identified without sorting them by the bit patterns to display the waveform.

Another application of the present invention is that a mask is set to an eye pattern as is well known and a waveform passing through a point of the eye pattern satisfying the mask condition is displayed with a continuous line. This allows easily finding the waveform satisfying the mask condition, or having a problem. The waveform satisfying the mask condition may not only be displayed just as a continuous line but also highlight-displayed for easy recognition.

Other application of the present invention may provide a user interface that allows a user to select one or more of bit patterns from the eight types and display an eye pattern with the waveforms of the selected bit patterns. This shows that a bit pattern passing through a problem portion in the eye pattern is which type of the bit patterns.

FIG. 6 is a flowchart of an embodiment according to the present invention. An eye pattern is displayed (step 62) in the eye pattern display area 36 according to a well known method, and a waveform along a continuous time axis is displayed in the waveform display area 38 (step 64). A user can set an overlay mode via the user interface of the screen or operation panel 18 (step 66) wherein the overlay mode displays a waveform on the eye pattern as necessary. The user may select an arbitrary point on the eye pattern with the cross-shaped mouse cursor 40 (step 68). The arbitrary point would be a point of a portion that seems to be out of a normal range in the eye pattern, for example. The waveform display apparatus highlight-displays a waveform that passes through the selected point (step 70). In addition, a portion of the waveform displayed in the waveform display area 38 corresponding to the highlighted displayed waveform in the eye pattern may be highlight-displayed (step 72).

FIG. 7 is a flowchart of the embodiment that displays a waveform passing through envelope points shown in FIG. 5. Steps corresponding to those of FIG. 6 have the same numbers and different steps are especially described below. After the eye pattern and waveform are displayed as similar to FIG. 6, if a user set an envelope mode via the interface (step 80) a waveform passing through envelope points of the eye pattern is displayed on the eye pattern (step 82). The following steps are similar to those of FIG. 6.

Figure 8:
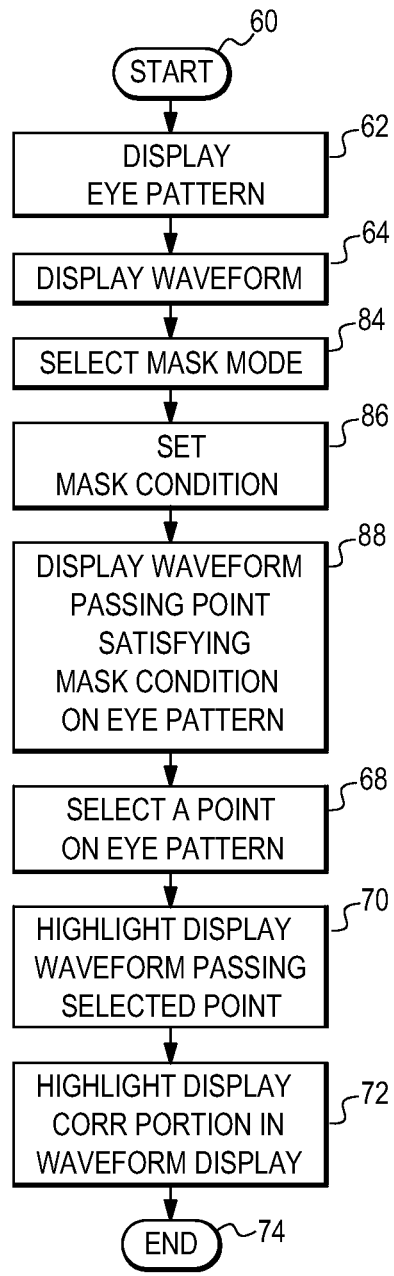
FIG. 8 is a flowchart of another process embodiment of a signal analysis method according to the present invention

FIG. 8 is a flowchart of the mask condition setting case described above. Similarly, steps different from those of FIG. 6 are described below. If a user selects the mask mode (step 84), a screen for setting the mask condition (not shown) appears and the user sets the mask condition with it (step 86). Then, a waveform passing through a point satisfying the mask condition is displayed on the eye pattern (step 88). The waveform (not shown) may be highlight-displayed as necessary.

Figure 9:
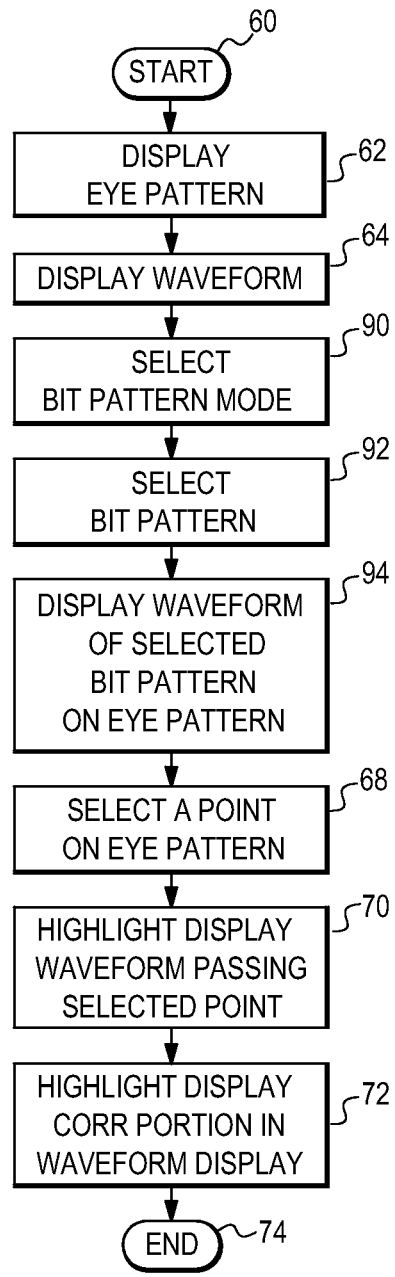
FIG. 9 is a flowchart of another process embodiment of a signal analysis method according to the present invention

FIG. 9 is a flowchart of a bit pattern mode. Similarly, steps different from those of FIG. 6 are described below. If a user selects the bit pattern mode (step 90), a screen to select one or more bit patterns appears and the user sets a desired bit pattern with it (step 92). Then, a waveform of the selected bit pattern is displayed on the eye pattern (step 94).

Although the invention has been disclosed in terms of the preferred embodiments disclosed herein, those skilled in the art will appreciate that modifications and improvements may be made without departing from the scope of the invention. In the above description, the highlight (high brightness) display is used for distinguishably displaying a waveform but another method may be available. The waveform may be distinguishably displayed by that a different color from the around, the thick line of the waveform, different pattern line of the waveform from the other portions, etc., for example. The eye pattern derived from the eight types of bit patterns 000 through 111 has been described as the embodiments but not limited to those.

The term "or" as used herein and in the following claims, is used in the inclusive sense. That is, it is to mean, "one or the other, or both".

What is claimed is:

1. A signal analyzer comprising:

means for displaying an eye pattern in a first display area, said eye pattern being derived from sample data of a signal under test, said eye pattern being stored in a bitmap form and indicating frequency information with colors or brightness;

means for selecting a single point on the eye pattern, wherein the eye pattern displaying means distinguishably displays a waveform which passes through the selected single point by highlighting the waveform in a predetermined color and brightness to distinguish that waveform from all other waveforms in response to selecting the single point; and means for displaying the sample data as a waveform in a second display area, wherein the waveform displaying means distinguishably displays a portion of the waveform displayed on the waveform displaying means corresponding to the waveform that the eye pattern displaying means distinguishably displays, wherein the first display area and the second display area are separate from one another.

2. The signal analyzer as recited in claim 1, further comprising:

means for displaying the sample data as a waveform, wherein the waveform displaying means displays portions of the waveform displayed on the waveform displaying means in different colors respectively corresponding to the waveforms that the eye pattern displaying means distinguishably displays.

3. A signal analyzer comprising:

means for displaying an eye pattern in a first display area that is derived from sample data of a signal under test in a bitmap form and indicates frequency information with colors or brightness;

means for setting a mask condition on the eye pattern;

means for selecting a single point on the eye pattern, wherein the eye pattern displaying means distinguishably displays a waveform that passes through a single point satisfying the mask condition by highlighting the waveform in a predetermined color and brightness to distinguish that waveform from all other waveforms in response to selecting the single point; and means for displaying the sample data as a waveform in a second display area, wherein the waveform displaying means distinguishably displays a portion of the waveform displayed on the waveform displaying means corresponding to the waveform that the eye pattern displaying means distinguishably displays, wherein the first display area and the second display area are separate from one another.

4. A signal analyzer comprising:
means for displaying an eye pattern in a first display area that is derived from sample data of a signal under test in a bitmap form and indicates frequency information with colors or brightness;
means for selecting a bit pattern;
means for selecting a single point on the eye pattern,
wherein the eye pattern displaying means displays a waveform of the selected bit pattern in response to selecting the single point by highlighting the waveform in a predetermined color and brightness to distinguish that waveform from all other waveforms;
means for displaying the sample data as a waveform in a second display area, wherein the waveform displaying means distinguishably displays a portion of the waveform displayed on the waveform displaying means corresponding to the waveform that the eye pattern displaying means distinguishably displays, wherein the first display area and the second display area are separate from one another.

5. A method for analyzing a signal, comprising steps of:
displaying an eye pattern in a first display area that is derived from sample data of a signal under test in a bitmap form and indicates frequency information with colors or brightness;
selecting a single point on the eye pattern;
distinguishably displaying a waveform that passes through the selected point in the eye pattern in response to selecting the single point by highlighting the waveform in a predetermined color and brightness to distinguish that waveform from all other waveforms; and
displaying the sample data as a waveform in a second display area, wherein a portion of the waveform displayed in the waveform displaying step corresponding to the waveform distinguishably displayed in the eye pattern is distinguishably displayed, wherein the first display area and the second display area are separate from one another.

6. An oscilloscope for displaying a waveform, comprising:
an acquisition system, said acquisition system acquiring samples of a signal under test;
a controller for controlling said acquisition system to acquire said samples of said signal under test;
a display system, coupled to said controller, for displaying said samples of said signal under test as a waveform; said display system also repeatedly displaying portions of said waveform to form an eye diagram;
an input device, coupled to said controller, said input device being operable by a user to select a single pixel of said eye diagram;
wherein in response to said selection of said single pixel of said eye diagram, said controller causes a signal passing through said single pixel to be highlighted in a predetermined color and brightness to distinguish said signal passing through said single pixel from all other signals that form said eye diagram; and
wherein in response to said selection of said single pixel of said eye diagram, said controller causes a portion of said waveform that corresponds to said signal passing through said single pixel to be highlighted in the same predetermined color and brightness to distinguish that portion of said waveform from all other portions of said waveform.

7. An oscilloscope for displaying a waveform, comprising:
an acquisition system, said acquisition system acquiring samples of a signal under test;
a controller for controlling said acquisition system to acquire said samples of said signal under test;
a display system, including a display screen, coupled to said controller, said display system displaying on a first portion of said display screen said samples of said signal under test as a waveform, and on a second portion of said display screen said display system also repeatedly displaying portions of said waveform to form an eye diagram;
an input device, coupled to said controller, said input device being operable by a user to select a single pixel of said eye diagram;
wherein in response to said selection of said single pixel of said eye diagram, said controller causes a signal passing through said single pixel to be highlighted in a predetermined color and brightness to distinguish said signal passing through said single pixel from all other signals that form said eye diagram;
wherein in response to said selection of said single pixel of said eye diagram, said controller causes that portion of said waveform that corresponds to said signal passing through said single pixel to be highlighted in the same predetermined color and brightness used to highlight said signal passing through said single pixel of said eye diagram to distinguish that portion of said waveform from all other portions of said waveform.

* * * * *